(12) United States Patent
Hessler et al.

(10) Patent No.: US 7,753,581 B2
(45) Date of Patent: Jul. 13, 2010

(54) SPIRAL SPRING MADE OF ATHERMAL GLASS FOR CLOCKWORK MOVEMENT AND METHOD FOR MAKING SAME

(75) Inventors: Thierry Hessler, Renens (CH); Joachim Grupp, Enges (CH)

(73) Assignee: The Swatch Group Research and Development Ltd, Marin (CH)

( * ) Notice: Subject to any disclaimer, the term of this patent is extended or adjusted under 35 U.S.C. 154(b) by 221 days.

(21) Appl. No.: 12/095,088

(22) PCT Filed: Nov. 13, 2006

(86) PCT No.: PCT/EP2006/010854

§ 371 (c)(1),
(2), (4) Date: May 27, 2008

(87) PCT Pub. No.: WO2007/059876

PCT Pub. Date: May 31, 2007

(65) Prior Publication Data

US 2009/0016173 A1     Jan. 15, 2009

(30) Foreign Application Priority Data

Nov. 25, 2005   (EP)   ................... 05025724

(51) Int. Cl.
*G04B 1/10* (2006.01)
*C03B 27/012* (2006.01)

(52) U.S. Cl. .................. 368/140; 65/33.2; 368/175; 267/166

(58) Field of Classification Search .......... 368/140, 368/127, 175; 65/33.2; 267/166
See application file for complete search history.

(56) References Cited

U.S. PATENT DOCUMENTS

| 5,881,026 | A | 3/1999 | Baur et al. | |
| 6,843,594 | B1* | 1/2005 | Moteki et al. | 368/140 |
| 6,863,435 | B2* | 3/2005 | Moteki et al. | 368/140 |
| 7,077,562 | B2 | 7/2006 | Bourgeois et al. | |
| 2005/0068852 | A1 | 3/2005 | Hessler et al. | |
| 2007/0133355 | A1* | 6/2007 | Hara et al. | 368/140 |
| 2007/0140065 | A1* | 6/2007 | Levingston | 368/127 |
| 2009/0116343 | A1* | 5/2009 | Levingston | 368/140 |

FOREIGN PATENT DOCUMENTS

CH   307683   8/1955

(Continued)

OTHER PUBLICATIONS

Mrotzek, Susanne et al., "Processing Techniques for photostructurable glasses," Glass Science and Technology, vol. 76, No. 1, 2003, pp. 22-27.

(Continued)

*Primary Examiner*—Vit W Miska
*Assistant Examiner*—Sean Kayes
(74) *Attorney, Agent, or Firm*—Griffin & Szipl, P.C.

(57) ABSTRACT

The balance spring is made from a photostructurable glass plate by UV irradiation, thermal treatment and etching, said glass having a Young's modulus thermal coefficient $CTE_0$. The value $CTE_0$ of selected zones of the balance spring are altered to a value $CTE_i$ by UV irradiation through one or several masks, possibly completed by a thermal treatment.

24 Claims, 3 Drawing Sheets

FOREIGN PATENT DOCUMENTS

| EP | 0 886 195 A1 | 12/1998 |
|---|---|---|
| EP | 1 422 436 A1 | 5/2004 |
| EP | 1 519 250 A1 | 3/2005 |

OTHER PUBLICATIONS

Brokmann, Ulrike et al., "UV laser radiation for microstructuring of photostructurable glasses," Glass Science and Technology, vol. 77, No. 5, 2004, pp. 249-252.

Becker, H et al., "Chemical analysis in photostructurable glass chips," Sensors and Actuators B 86, 2002, pp. 271-279.

"Forturan," printed from http://web.archive.org/web/20010119084600/http://design.caltech.edu/micropropulsion/forturane.html, printed Oct. 20, 2006.

Yuritsyn, N.S., "Elastic properties of glasses in the sodium borosilicate system," I. V. Grebenshchikov Institute of Silicate Chemistry, Academy of Sciences of the USSR, Leningrad, 1990, pp. 62-67.

Yuritsyn, N.S., "Principles of the Change in the Elastic Properties of Glasses of the Sodium Borosilicate System Along Sections with a Constant Concentration of SiO2," I. V. Grebenshchikov Institute of Silicate Chemistry, Academy of Sciences of the USSR, Leningrad, 1990, pp. 103-107.

International Search Report issued in corresponding application No. PCT/EP2006/010854, completed Aug. 10, 2007 and mailed Aug. 20, 2007.

* cited by examiner

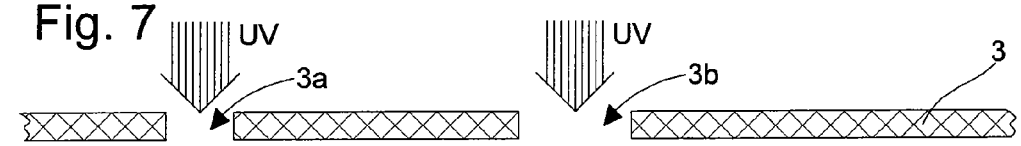
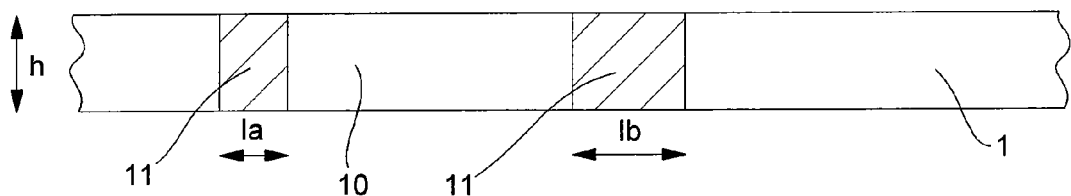
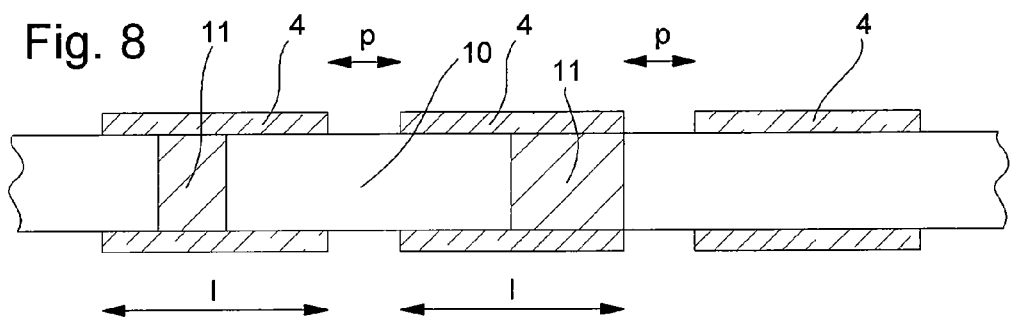
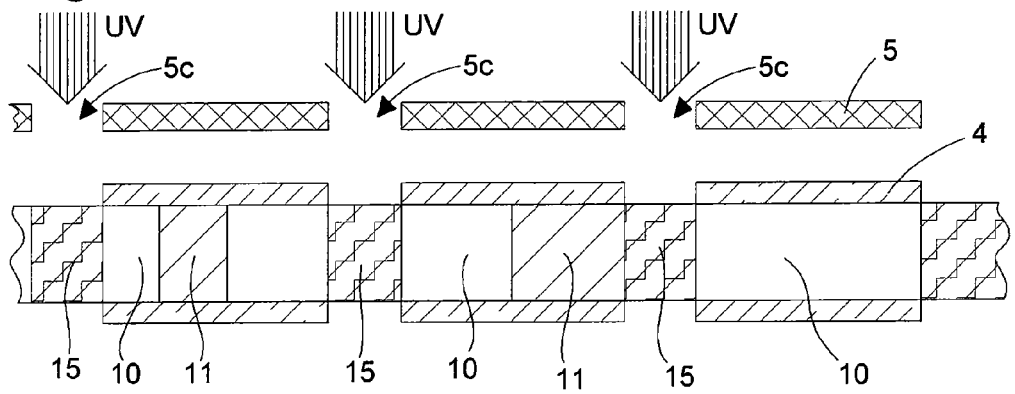
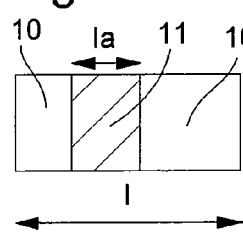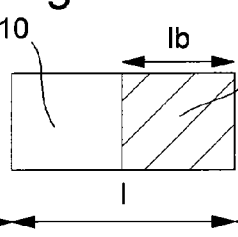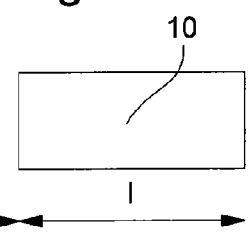

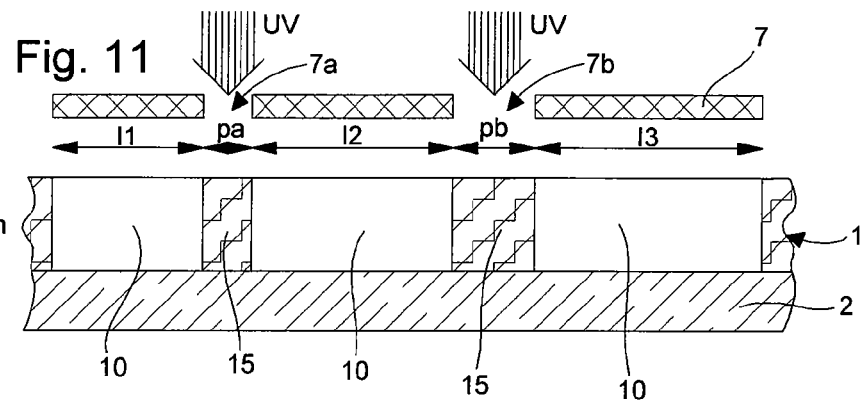
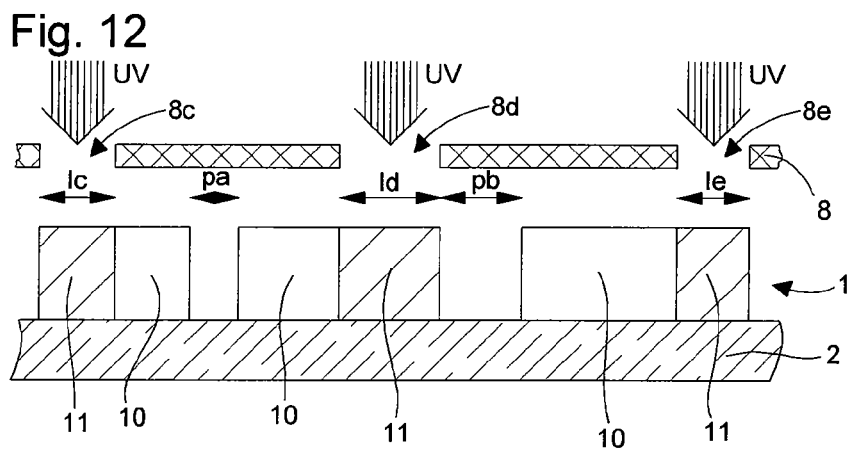
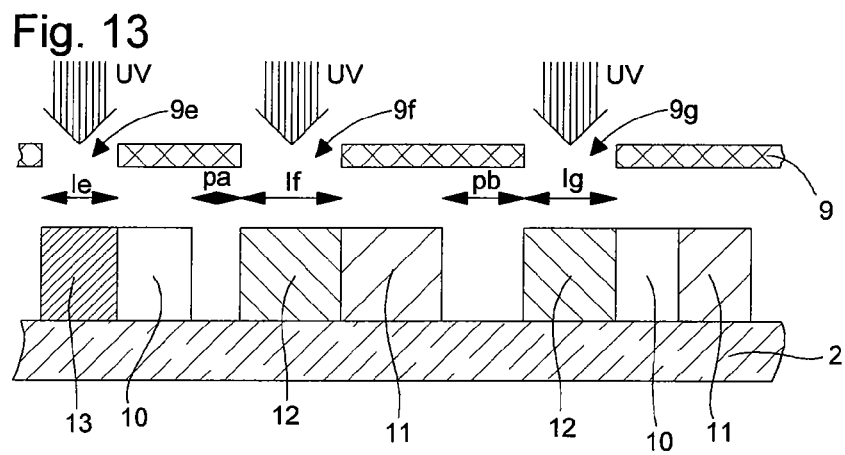
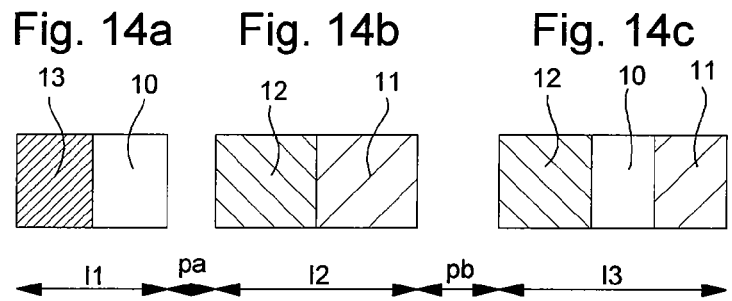

SPIRAL SPRING MADE OF ATHERMAL GLASS FOR CLOCKWORK MOVEMENT AND METHOD FOR MAKING SAME

This is a National Phase Application in the United States of International Patent Application No. PCT/EP2006/010854 filed Nov. 13, 2006, which claims priority on European Patent Application No. 05025724.5, filed Nov. 25, 2005. The entire disclosures of the above patent applications are hereby incorporated by reference.

FIELD OF THE INVENTION

The present invention concerns a balance spring for a timepiece movement made of special glass and by a method that makes its mechanical properties, and in particular its Young's modulus thermal coefficient (CTE) almost totally independent of temperature, while benefiting from its non-magnetic properties.

BACKGROUND OF THE INVENTION

For a long time it has been sought to minimise the influence of variations in external conditions, in particular temperature and magnetic field, on the isochronism of a sprung balance regulating system by acting on the construction and choice of materials.

As regards the balance spring, since the discovery of invar, which is an Fe—Ni alloy, at the beginning of the $20^{th}$ century, more and more complex alloy compounds have been proposed in order to tend towards optimum quality. EP Patent No. 0 886 195 discloses for example Niobium and Zirconium alloy compounds further containing an interstitial doping agent formed at least in part of oxygen and allowing the CTE value to be controlled. Given the complexity of the compounds and the use of rare metals, the cost of the final product is high. Moreover, manufacturing a metallic balance spring relies on complex metallurgic processes (wire drawing, hardening, annealing, etc. . . . ) that do not guarantee perfect reproducibility of the desired resilient properties, such that it is still necessary to pair the balance and spring during assembly.

It has also been sought for a long time to replace an alloy by another material that does not have the drawbacks of metal. CH Patent No. 307 683, published in 1955 proposes fabricating a balance spring in glass with a silicon content such that the value of its expansion coefficient is practically zero without it being necessary to add any rare metal. This patent does not disclose how such a balance spring is made, nor what influence it has on the CTE.

A more recent document, EP Patent No. 1519250 discloses a sprung balance resonator that is thermocompensated owing to cut and structuring along determined orientations in relation to the crystallographic axes of a quartz crystal. Only qualified persons can implement such manufacturing. It will also be observed that the crystalline nature of quartz makes the balance spring brittle under shock causing fissures that propagate along the crystalline planes.

SUMMARY OF THE INVENTION

It is thus an object of the present invention to overcome the drawbacks of the aforecited prior art by providing a glass balance spring manufactured by a method that both controls mechanical properties locally, particularly the Young's modulus thermal coefficient (CTE) of said balance spring and its coefficient of elasticity and can be manufactured in batches at a lower cost.

The material thus chosen for manufacturing the glass balance spring formed of coils of uniform height $h$ and locally of width $l$ is a photostructurable glass initially having a Young's modulus thermal coefficient ($CTE_0$) preferably close to zero. This glass alters the Young's modulus coefficient of expansion ($CTE_i$) locally by irradiation, said irradiation possibly being completed by a high temperature thermal treatment.

This alteration can be carried out on one or several coils or coil zones having different $CTE_i$ along the balance spring. The $CTE_i$ alteration can also be performed on part of the width of the coils, over all or part of their length, or only on one part of the height of the coils.

This balance spring can be batch manufactured from a photostructurable glass plate having a Young's modulus thermal coefficient $CTE_0$, in accordance with two methods relying on the same principles.

According to a first method, UV illumination is carried out through a first mask on zones of the glass corresponding to the spaces that will subsequently have to be freed between the coils. In the next step, a high temperature thermal treatment is carried out which embrittles the zones that have been illuminated, without however any destructive effect. In the next step a new UV illumination is carried out through a second mask whose apertures are arranged above coils, coil zones, over all or part of their width to alter the initial $CTE_0$ to a value of $CTE_i$. The preceding step can be repeated with a third mask, and with UV illumination characteristics altering the initial $CTE_0$ to a value $CTE_2$ over only one part of the height of the coil, this step preferably being performed at the same time on the top and bottom surfaces of said balance spring.

It is clear that the second and third masks can have common aperture zones, such that the initial $CTE_0$ is altered to a value $CTE_3$ that may be different from the preceding values.

In a last step, the zones between the coils that have been embrittled by UV and thermal treatment are removed by etching.

According to a second method, a glass plate is fixed to a substrate resistant to acid etching and the balance spring is first shaped, by means of a first mask, by UV illumination and thermal treatment and then acid etching. At the end of this step the coils are separated but remain linked to the substrate. In at least one following step, UV illumination is carried out through a mask whose apertures correspond to coil zones whose $CTE_i$ one wishes to alter. In a last step the balance spring is released from the substrate and an additional thermal treatment could be performed to obtain an additional adjustment of the CTE.

If necessary, it is possible to perform an additional thermal treatment to obtain an additional adjustment of the CTE, after each UV illumination for altering $CTE_0$, in both the first and the second method.

According to another aspect of the invention, the mask used to define the contour of the balance spring can also be used to vary the pitch and/or the width of the coils along said balance spring or on determined coil zones.

According to yet another aspect of the invention, via the choice of an appropriate radiation source, it is possible to alter the $CTE_0$ locally in the entire height of the coil, or only over a part of the height thereof.

BRIEF DESCRIPTION OF THE DRAWINGS

Other features and advantages of the present invention will appear more clearly in the following description of various embodiments given by way of non-limiting illustration, with reference to the annexed drawings, in which:

FIGS. 7 to 9 show the steps of a first method for altering a selected zone of the balance spring;

FIGS. 10A, 10B and 10C show the sections of three different coils altered by the first method;

FIGS. 11 to 13 show a second method for altering a selected zone of the balance spring, and FIGS. 14A, 14B and 14C show the straight sections of three different coils, altered by the second method.

DETAILED DESCRIPTION OF THE INVENTION

Figure 1:
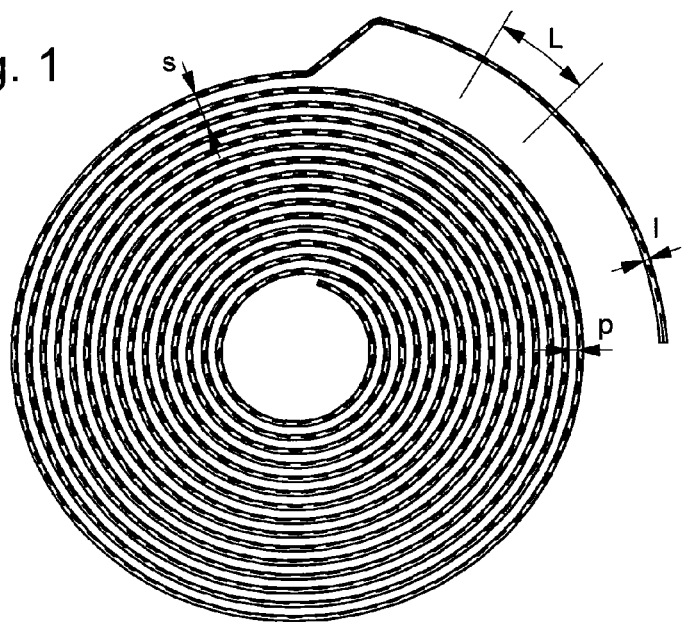
FIG. 1 shows a glass balance spring.

FIG. 1 shows a top view of a balance spring made from a photostructurable glass with a low Young's modulus thermal coefficient $CTE_0$. A very large number of types of glass is known, whose silicate based compositions incorporate certain doping agents and/or additives, such as cerium oxide, silver, tin, or antimony which will render parts of the glass, subjected to ultraviolet irradiation and thermal treatment, easy to etch chemically in an anisotropic manner, for example by a hydrofluoric acid. This property is well known and already used for fabricating for example microfluidic devices. Such glass is for example available from Schott AG in Germany under the trademark Foturan® or from Hoya Corp in Japan, under the reference PEG 3. These types of photostructurable glass are currently only used for their properties for obtaining MEMS via unconventional machining techniques.

FIGS. 2 to 6 show a top view of examples of alteration to the CTE of a coil zone L of a balance spring that initially had a Young's modulus thermal coefficient $CET_0$.

Figure 2:
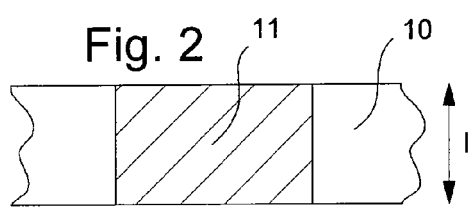
FIGS. 2 to 6 show a top view of various ways of altering a selected zone of the balance spring.

FIG. 2 shows that, for a zone 11, over the entire width $l$, the initial $CTE_0$ has been altered to $CTE_1$. It is clear that this alteration can extend over several coils, or can alternate coil zones with a Young's modulus thermal coefficient of $CTE_0$ and $CTE_1$.

Figure 3:
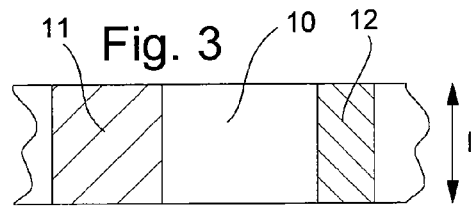

As shown in FIG. 3, it is also possible to alter the initial Young's modulus thermal coefficient $CTE_0$ to have a value $CTE_1$, in one zone 11 and $CTE_2$ in one zone 12, these zones being separated by a zone 10 of $CTE_0$. Zones 11 and 12 could also be joined.

Figure 4:
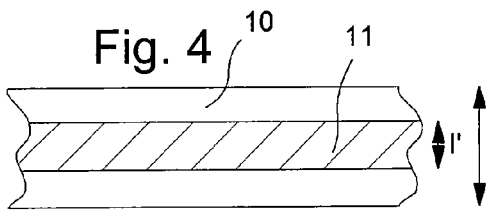

According to another embodiment shown in FIG. 4, it is possible to alter the initial Young's modulus thermal coefficient $CTE_0$ over only one zone 11 of the balance spring having a width $l'$ less than $l$. In the example shown, zone 11 is located substantially at the centre, but it is clear that it could be provided in the thickness of the external surface of internal surface, or even in both at the same time.

Figure 5:
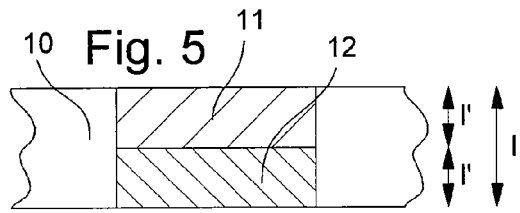

FIG. 5 illustrates another variant in which the Young's modulus thermal coefficient is altered from value $CTE_0$ to a value $CTE_1$ in an external zone 11 of width $l'$ and to a value $CTE_2$ in an inner zone 12 of width $l''$, these two zones being joined.

Figure 6:
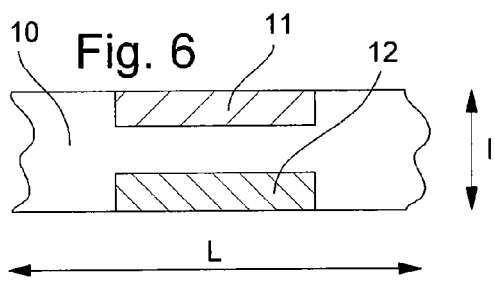

FIG. 6 illustrates the possibility of having, in a given zone of the balance spring along the straight section, a value $CTE_1$ in a zone 11, a value $CTE_2$ in a zone 12 and a value $CTE_0$ in a zone located between zones 11 and 12. Other possibilities will be illustrated in the following description.

By having this freedom to alter the initial $CTE_0$ of the photostructurable glass used, one in a way creates an optimised "apparent" CTE to obtain a sprung balance system frequency that is practically independent of temperature variations, even if the initial $CTE_0$ is a little further from the optimum value zero.

It should also be noted that the method and the CTE alteration can have a favourable influence on the coefficient of expansion $\alpha_s$, which is involved in the determination of frequency, even if its influence is considerably less significant.

Reference will now be made to FIGS. 7 to 10c to describe a first embodiment of a glass balance spring according to the invention.

FIGS. 7 to 10c show in cross-section, along the arrow S, three joined coils of height $h$. It should be noted that the coil height/width ratio has not been respected in order to make the drawings more comprehensible.

Starting from a glass plate 1, having an initial Young's modulus thermal coefficient $CTE_0$ and a thickness $h$ that may be obtained by machining and polishing, UV illumination is performed through a mask 3, as shown in FIG. 7. Mask 3 includes windows 3a, 3b, etc. . . . arranged above the coils or coil zones 11 whose initial $CTE_0$ one wishes to alter to a determined value $CTE_1$, by UV irradiation through said windows. It will be observed that these windows may be provided over only a part of the width of a coil. By way of example, window 3a has a width $l_a$ substantially in the median part of the coil, and window 3b has a width $l_b$ on an edge of the coil. In the step shown in FIGS. 8 and 9, masks 4 and 5 include windows 5c whose aperture is located above zones 15 that have subsequently to be removed to obtain the space that one wishes to have between the coils, i.e. a pitch p, which in this example remains constant at every point, the coils having a uniform width l. The UV radiation source used depends upon the absorption band of the glass used. It is for example a UV lamp whose spectral distribution peak is located between 200 and 400 nm. It is also possible to use another source of radiation, such as an Eximer $XeCl_2$ laser whose emission peak is 308 nm, or $KrF_2$ having an emission peak of 248 nm.

In the next step, which is not shown, the photostructurable glass plate 1 is subjected to a high temperature thermal treatment, of the order of 600° C. depending upon the composition of the glass. This thermal treatment makes zones 15 that have had UV illumination easier to remove selectively by subsequent etching.

At this stage of the process it is possible to carry out the etch which will allow zones 15 to be selectively removed and the release the coils. This etch is carried out in a conventional manner, for example in an approximately 10% hydrofluoric acid bath at ambient temperature and under ultrasound.

It is also possible to carry out an additional thermal treatment to obtain an additional adjustment of the altered CTEs.

FIGS. 10a and 10b show by way of example the possible configurations. FIG. 10a shows a zone 11 of width $l_b$ whose CTE has been altered to $CTE_1$, on either side of two zones 10 whose initial $CTE_0$ has not been altered. In FIG. 10b $CTE_0$ is altered to a value $CTE_1$ over a width $l_c$ located close to the edge of the coil. It is clear that other configurations with altered CTE zones are possible depending upon the shapes of the windows of mask 5, and that these configuration may concern one coil zone, several coils, or the entire balance spring.

Of course, it is possible, prior to carrying out the etch, to subject coils or coil zones to another UV illumination through a mask 6 which, in this example, comprises windows 6d having the same width as the balance spring. By selecting appropriate UV irradiation, for example an Eximer $KrF_2$ laser at 248 nm and by controlling the exposure time, the Young's modulus thermal coefficient can be altered from the initial value $CTE_0$ to a value $CTE_2$ in a zone 12, which only penetrates part $h'$ of the height $h$ of the balance spring.

In such case, it is desirable to illuminate the balance spring on both faces thereof as shown in FIG. 10c.

If one wishes to make such an alteration for all of the coils, it is clear that it is not necessary to have any mask. It is then possible to envisage performing this UV illumination, once the balance spring has been mounted in order to make a fine adjustment of the CTE value and thereby the frequency.

FIGS. 11 to 14c illustrate a second manufacturing method and a certain number of variants, which could also be applied to the first method. In a first step shown in FIG. 11, a glass plate 1 of thickness h, having the features indicated at the beginning, is fixed to a substrate 2 resistant to acid etching. Substrate 2 is for example a ceramic plate.

The balance spring is then shaped by UV illumination through a mask 7 whose windows 7a, 7b corresponding to the free spaces between the coils and whose opaque parts determine the planar contour of the balance spring. As can be seen, by selecting an appropriate mask 7, it is possible to devise the contour of the balance spring with a variable pitch $p_a$, $p_b$, etc. . . . with a variable width $l_1$, $l_2$, $l_3$, etc. . . . or with both. As previously, this method is completed by a high temperature thermal treatment in order to embrittle the zones that have just been illuminated.

In the next step that is not shown, the illuminated parts are removed by acid etching as indicated in the first method.

In the next step, shown in FIG. 12, UV illumination is carried out through a second mask 8 whose windows 8c, 8d, 8e will define coil zones 11 whose Young's modulus thermal coefficient will be altered from the value $CTE_0$ to $CTE_1$, possibly by carrying out a complementary high temperature thermal treatment.

By using an additional mask 9, as shown in FIG. 13, and by varying the UV illumination conditions, new windows 9e, 9f, 9g will define new zones 12 of the balance spring for which the Young's modulus thermal coefficient will have been altered to a value $CTE_2$, or zones 13 where it will have been altered to a value $CTE_3$ if windows, or window zones of masks 8 and 9 coincide, as is the case for windows 8c and 9e. The altered zones may be subjected to a complementary high temperature thermal treatment.

In a last step shown in FIGS. 14a and 14b, the balance spring is separated from substrate 2. In this example coils or coil zones have been obtained with the respective values CTE, $CTE_3/CTE_0$ (FIG. 14a), $CTE_2/CTE_1$ (FIG. 14b), $CTE_2/CTE_0/CTE_1$.

By acting on the shape of the masks and/or the number thereof, those skilled in the art can devise other variants without departing from the scope of the invention to improve the mechanical properties of a glass balance spring, and particularly the resistance thereof to temperature variations, which are detrimental to isochronism.

What is claimed is:

1. A glass balance spring including coils of height $\underline{h}$ and locally a width $\underline{l}$, wherein the glass is of a photostructurable type including at least two zones (10, 11, 12, 13) respectively having a different Young's modulus thermal coefficient ($CTE_0$, $CTE_1$, $CTE_2$, $CTE_3$) in order to adapt the mechanical properties of said balance spring selectively.

2. The balance spring according to claim 1, wherein said at least two zones (10, 11, 12, 13) extend over at least one part of a coil.

3. The balance spring according to claim 2, wherein said at least two zones (10, 11, 12, 13) each extend over all of said width.

4. The balance spring according to claim 3, wherein said at least two zones (10, 11, 12, 13) extend consecutively along the balance spring.

5. The balance spring according to claim 2, wherein said at least two zones (10, 11, 12, 13) each extend over one part of said width I.

6. The balance spring according to claim 1, wherein said at least two zones (10, 11, 12, 13) each extend over one part of said width I.

7. The balance spring according to claim 6, wherein said at least two zones (10, 11, 12, 13) extend one above the other.

8. The balance spring according to claim 7, wherein said at least two zones (10, 11, 12, 13) extend parallel to each other over the entire length of said balance spring.

9. The balance spring according to claim 7, wherein said at least two zones (10, 11, 12, 13) extend parallel to each other.

10. The balance spring according to claim 6, wherein said at least two zones (10, 11, 12, 13) extend parallel to each other.

11. The balance spring according to claim 6, wherein said at least two zones (10, 11, 12, 13) extend along the same thickness (I') along the width I.

12. The balance spring according to claim 1, wherein said at least two zones (10, 11, 12, 13) extend over the entirety of said height h.

13. The balance spring according to claim 1, wherein said at least two zones (10, 11, 12, 13) each extend over one part of the height h.

14. A regulating system for a timepiece movement including a balance cooperating with a balance spring according to claim 1, for regulating the isochronism of said system by varying the Young's modulus thermal coefficient ($CTE_0$, $CTE_1$, $CTE_2$, $CTE_3$) of at least one of the zones (10, 11, 12, 13).

15. A method of manufacturing a glass balance spring for a timepiece movement, formed of coils of rectangular cross section of height $\underline{h}$, of width $\underline{I}$, and having between them a pitch $\underline{p}$, wherein it includes the steps of:
  a) taking a photostructurable glass plate (1) of thickness $\underline{h}$ including a Young's modulus thermal coefficient $CTE_0$;
  b) carrying out UV illumination through a first mask (5, 7) whose windows (5c, 7a, 7b) correspond to the spaces (15) that subsequently have to be released between the coils for structuring at least one balance spring on said plate;
  c) carrying out a high temperature thermal treatment;
  d) creating at least one zone (11, 12, 13) using UV illumination through a second mask (3, 8, 9) over at least one coil whose Young's modulus thermal coefficient one wishes to alter from the initial value $CTE_0$ to a value $CTE_1$, and
  e) carrying out an etch to remove the spaces (15) that have been treated in steps b) and c).

16. The method according to claim 15 wherein the mask (5, 7) used for structuring said at least one balance spring includes windows (5c, 7a, 7b) for varying the pitch p (pa, pb) between the coils and/or their width I (I1, I2, I3).

17. The method according to claim 16, wherein a thermal treatment is also carried out after step e).

18. The method according to claim 15, wherein a thermal treatment is also carried out after step e).

19. The method according to claim 15, wherein the step d) is shortened in order to create the zone (11, 12, 13) over only one part of the height h of the balance spring.

20. The method according to claim 15 wherein step b) is repeated at least once with an additional mask (9) whose windows (9e, 9f, 9g) correspond to the coil zones whose initial Young's modulus thermal coefficient one wishes to alter to a value $CTE_2$.

21. The method according to claim 20 wherein the first mask (3, 8) and the additional mask (9) have common window zones for altering the initial Young's modulus thermal coefficient to a value $CTE_3$.

22. The method according to claim 15, wherein each step d) is carried out prior to steps b) and c).

23. The method according to claim 15 including, after step a), a step of securing a substrate resistant to the etch of step d) to said plate.

24. The method according to claim 15, wherein the UV illumination is achieved using a source emitting along a wavelength comprised between 200 and 400 nm.

* * * * *